United States Patent
Boulestin

(10) Patent No.: US 11,128,273 B2
(45) Date of Patent: Sep. 21, 2021

(54) VARIABLE GAIN AMPLIFIER EMBEDDED IN A RECEPTION CHAIN

(71) Applicant: STMicroelectronics SA, Montrouge (FR)

(72) Inventor: Renald Boulestin, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 139 days.

(21) Appl. No.: 16/545,981

(22) Filed: Aug. 20, 2019

(65) Prior Publication Data

US 2020/0076385 A1 Mar. 5, 2020

(30) Foreign Application Priority Data

Sep. 5, 2018 (FR) ........................................ 1857957

(51) Int. Cl.
*H03F 3/45* (2006.01)
*H04W 4/80* (2018.01)
*H04B 1/18* (2006.01)
*H03G 3/30* (2006.01)
*H03F 3/68* (2006.01)
*H04B 1/16* (2006.01)

(52) U.S. Cl.
CPC ........... *H03F 3/45179* (2013.01); *H03F 3/68* (2013.01); *H03G 3/3042* (2013.01); *H04B 1/1607* (2013.01); *H04B 1/18* (2013.01); *H04W 4/80* (2018.02); *H03F 2200/451* (2013.01); *H03F 2203/45374* (2013.01); *H03F 2203/45676* (2013.01); *H03G 2201/103* (2013.01); *H03G 2201/106* (2013.01); *H03G 2201/307* (2013.01); *H03G 2201/702* (2013.01)

(58) Field of Classification Search
CPC .......... H03F 3/45; H03G 3/30; H03G 3/3042
USPC ............................... 330/254, 257; 455/253.2
See application file for complete search history.

(56) References Cited

U.S. PATENT DOCUMENTS

| 5,493,205 A | 2/1996 | Gorecki |
| 7,538,616 B1* | 5/2009 | Voo ....................... H03F 1/0205 330/253 |
| 2002/0175761 A1 | 11/2002 | Bach et al. |
| 2005/0024142 A1 | 2/2005 | Sowlati |
| 2013/0271106 A1* | 10/2013 | Tsai ........................ G05F 3/262 323/315 |
| 2017/0244371 A1 | 8/2017 | Turker Melek et al. |

* cited by examiner

*Primary Examiner* — Steven J Mottola
(74) *Attorney, Agent, or Firm* — Slater Matsil, LLP

(57) ABSTRACT

A variable-gain amplifier includes two amplification and attenuation branches, and first and a second resistive elements that are coupled between the two branches. Each branch includes a voltage follower stage and a configurable amplification stage. The voltage follower stages are intended to receive a differential signal and are configured to deliver, via the first resistive element, an intermediate differential current signal. The amplification stages are intended to receive the intermediate differential current signal and a digital control word, and are configured to deliver, via the second resistive element, an output differential voltage signal depending on the value of the digital control word.

20 Claims, 5 Drawing Sheets

VARIABLE GAIN AMPLIFIER EMBEDDED IN A RECEPTION CHAIN

CROSS-REFERENCE TO RELATED APPLICATIONS

This application claims priority to French Patent Application No. 1857957, filed on Sep. 5, 2018, which application is hereby incorporated herein by reference.

TECHNICAL FIELD

Embodiments of the invention relate to communication devices and, in particular embodiments, to a variable gain amplifier embedded in a reception chain.

BACKGROUND

Generally speaking, a near-field communication device comprises a reception chain in order to receive, via an associated antenna, a radio frequency signal that is modulated around 13.56 MHz.

In order to perform subsequent processing operations on the received signal, it is necessary beforehand to adjust its amplitude within a predetermined range.

FIG. 1 illustrates a conventional reception chain Rx including an antenna coupling stage 1 comprising linking capacitors and a balun.

The antenna coupling stage 1 includes an input coupled to an antenna 2 and an output differential pair coupled to a differential input of an amplifier stage 3.

The amplifier stage 3 includes a variable-gain amplifier 3a and a capacitive attenuator 3b, and is coupled to an analog-to-digital converter 4 by way of an anti-aliasing filter 5 that is known to those skilled in the art.

The reception chain Rx furthermore includes a variable-gain controller 6, commonly known to those skilled in the art under the English acronym "AGC" ("automatic gain control"). The controller 6 is coupled to the converter 4, and the amplifier stage 3 is configured to drive the amplifier 3a and the attenuator 3b on the basis of the resolution of the converter 4 such that the amplitude of a signal received via the antenna 2 does not exceed the maximum resolution of the converter 4.

To this end, the controller 6 is configured to attenuate the amplitude of the received signal via the attenuator 3b if this amplitude is too high, and increase the amplitude of the received signal via the amplifier 3a if this amplitude is too low.

A conventional variable-gain amplifier generally includes a drivable resistor array that allows the voltage gain of the amplifier to be adjusted by modifying the resistance of the drivable resistor array.

The use of such a resistor array introduces variable stray capacitances that slow the signal processing time of the amplifier to a greater or lesser extent.

Furthermore, such a variable-gain amplifier is generally configured to directly generate an amplified output voltage from an amplified DC current, and this amplified output voltage is generally limited by the supply voltage of the amplifier.

As the supply voltage of integrated circuits has been constantly decreasing in recent years in order to reduce overall power consumption, the voltage gain of the variable-gain amplifier is rapidly reaching the ceiling that is limited by the supply voltage.

SUMMARY

Embodiments of the invention relate to communication devices. Particular embodiments relate to radio frequency communication devices, for example, to near-field communication devices known under the acronym "NFC" in the technical field. In a particular example a variable-gain amplifier (VGA) devices can be incorporated into reception chains within these near-field communication devices.

Embodiments can provide a technical solution with low complexity and with low power consumption that makes it possible to ensure low distortion on a signal amplified by a variable-gain amplifier, notably with a very low supply voltage, for example less than 2.5 V, and to reduce the silicon surface of the amplifier, while at the same time stabilizing its signal processing time.

According to one aspect, what is proposed is a variable-gain amplifier comprising two amplification branches, and a first and a second resistive element that are coupled between the two branches, respectively.

Each branch includes a voltage follower stage and a configurable amplification stage.

The voltage follower stages are intended to receive a differential signal and are configured to deliver, via the first resistive element, an intermediate differential current signal.

The amplification stages are intended to receive the intermediate differential current signal and a digital control word, and configured to deliver, via the second resistive element, an output differential voltage signal depending on the value of the digital control word.

Advantageously, such an amplifier uses two voltage follower stages that are able to perform impedance matching on the differential signal so as to achieve virtual unity gain.

Moreover, the use of the first resistive element advantageously allows a first conversion of the differential voltage signal into an AC differential current signal. The intermediate differential current signal is the combination of the AC differential current signal and a DC current signal.

The configurable amplification stages are driven by the digital control word so as to make it possible to amplify the intermediate differential current signal depending on the value of the digital control word. It should be noted that it is also possible to attenuate the intermediate differential current signal by receiving an appropriate value of the digital control word.

It is therefore advantageously possible to no longer use a capacitive attenuator in a reception chain as illustrated in FIG. 1.

Here again, the use of the second resistive element advantageously allows a second conversion of the amplified intermediate differential current signal into an output differential voltage signal.

What is more, the fact that such a second conversion has been performed in a delayed manner reduces possible distortions on the output differential voltage signal.

According to one embodiment, each amplification stage includes a first current mirror array coupled to a first output terminal, a second current mirror array coupled to a second output terminal, and a third current mirror array coupled between the first and second output terminals.

Each voltage follower stage is coupled to the corresponding first output terminal. The first resistive element is coupled between the first output terminals. The second resistive element is coupled between the second output terminals. Plus, the first, second and third current mirror arrays are able to be driven depending on the value of the digital control word.

According to another embodiment, the first, second and third current mirror arrays are configured to have a first, a second and a third current transfer rate, respectively, and the first transfer rate multiplied by the third transfer rate is equal to the second transfer rate.

This relationship between the first, second and third transfer rates advantageously makes it possible to keep the DC portion of the intermediate differential current signal stable.

By way of non-limiting example, the first resistive element may have a first fixed equivalent resistance and the second resistive element may have a second fixed equivalent resistance.

The absence of variable resistances, for example a resistor array driven by a digital control word, allows a stable period between the reception of a differential signal and the delivery of an output differential voltage signal and an unobtrusive silicon surface of the amplifier.

According to yet another embodiment, the first fixed equivalent resistance is substantially equal to the second fixed equivalent resistance.

In this case, all of the variations with regard to the gain of the amplifier are performed by the first, second and third current mirror arrays depending on the value of the digital control word.

According to another aspect, what is proposed is a reception chain comprising a variable-gain amplifier such as defined above, and a variable-gain controller configured to deliver the digital control word to the variable-gain amplifier.

According to yet another aspect, what is proposed is a radio frequency communication device comprising a reception chain such as defined above.

The radio frequency communication device may be for example a near-field communication device.

BRIEF DESCRIPTION OF THE DRAWINGS

Other advantages and features of the invention will become apparent upon examining the detailed description of completely non-limiting embodiments and the appended drawings, in which.

DETAILED DESCRIPTION OF ILLUSTRATIVE EMBODIMENTS

Figure 2:
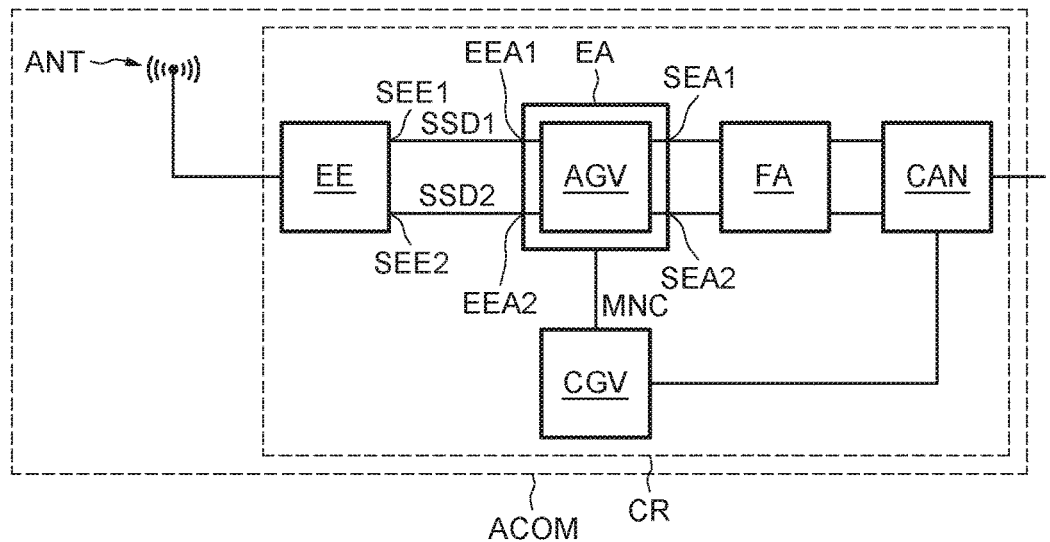

Reference is made first of all to FIG. 2 in order to illustrate one exemplary embodiment of a radio frequency communication device ACOM, in this case for example a near-field communication (NFC) device including an antenna ANT and a reception chain CR connected to the antenna ANT.

The reception chain CR includes an input stage EE, an amplification and attenuation stage EA, an anti-aliasing filter FA, an analog-to-digital converter CAN and a variable-gain controller CGV.

The input stage EE is coupled to the antenna ANT and comprises a differential amplifier connected as a follower and including an output differential pair SEE1, SEE2.

The amplification and attenuation stage EA includes an input differential pair EEA1, EEA2 coupled to the output differential pair SEE1, SEE2, respectively, and an output differential pair SEA1, SEA2 coupled to the converter CAN via the anti-aliasing filter FA, known to those skilled in the art.

The controller CGV is coupled between the converter CAN and the amplification and attenuation stage EA, and configured to deliver a digital control word MNC depending on the resolution of the converter CAN.

The value of the gain of the stage EA is driven by the digital control word MNC such that the amplitude of a signal received by the converter CAN is within the maximum resolution of the converter CAN.

The amplification and attenuation stage EA in this case includes a variable-gain amplifier AGV intended to receive a differential signal SSM1, SSD2 via the input differential pair EEA1, EEA2 and the digital control word MNC, and configured to adjust the value of the gain of the stage EA depending on the digital control word MNC.

Figure 1:
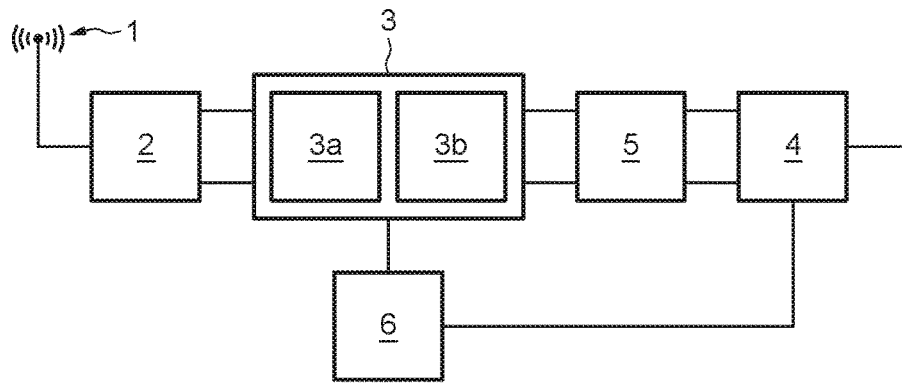
FIG. 1, described above, schematically illustrates one embodiment of a reception chain according to the prior art, and FIGS. 2, 3, 4, 5, 6, & 7 schematically illustrate embodiments of the invention.

It should be noted that the amplification and attenuation stage EA does not include a capacitive attenuator that is generally incorporated into an equivalent conventional stage as illustrated in FIG. 1, because the variable-gain amplifier AGV is advantageously configured to make it possible not only to amplify but also to attenuate the differential signal SSD1, SSD2 depending on the value of the digital control word MNC.

Figure 3:
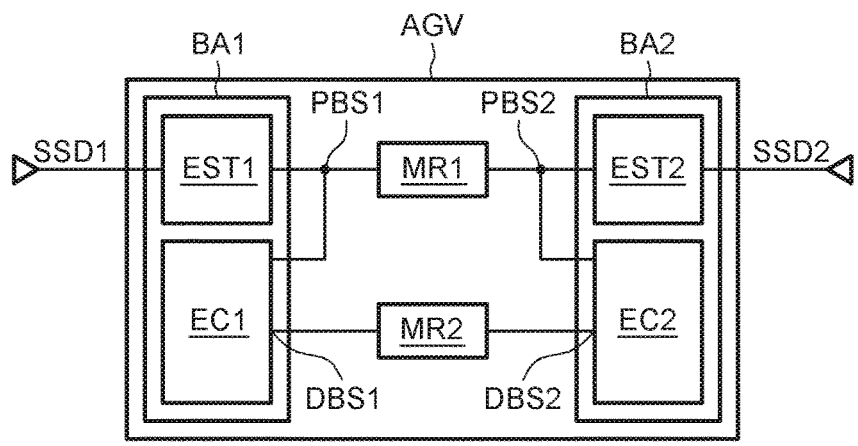

Reference is now made to FIG. 3 in order to illustrate one exemplary embodiment of the variable-gain amplifier AGV.

The amplifier AGV includes two amplification branches BA1, BA2, a first resistive element MR1 and a second resistive element MR2.

Each amplification branch BA1, BA2 includes a voltage follower stage EST1, EST2 and a configurable amplifier stage EC1, EC2.

The voltage follower stages EST1, EST2 are intended to receive the differential signal SSD1, SSD2.

Each amplifier stage EC1, EC2 includes a first output terminal PBS1, PBS2 and a second output terminal DBS1, DBS2.

Each amplification stage EC1, EC2 is coupled to a corresponding voltage follower stage EST1, EST2 via the first output terminal PBS1, PBS2.

The first resistive element MR1 is coupled between the first output terminals PBS1, PBS2 of the two branches BA1, BA2.

The second resistive element MR2 is coupled between the second output terminals DBS1, DBS2 of the two branches BA1, BA2.

Figure 4:
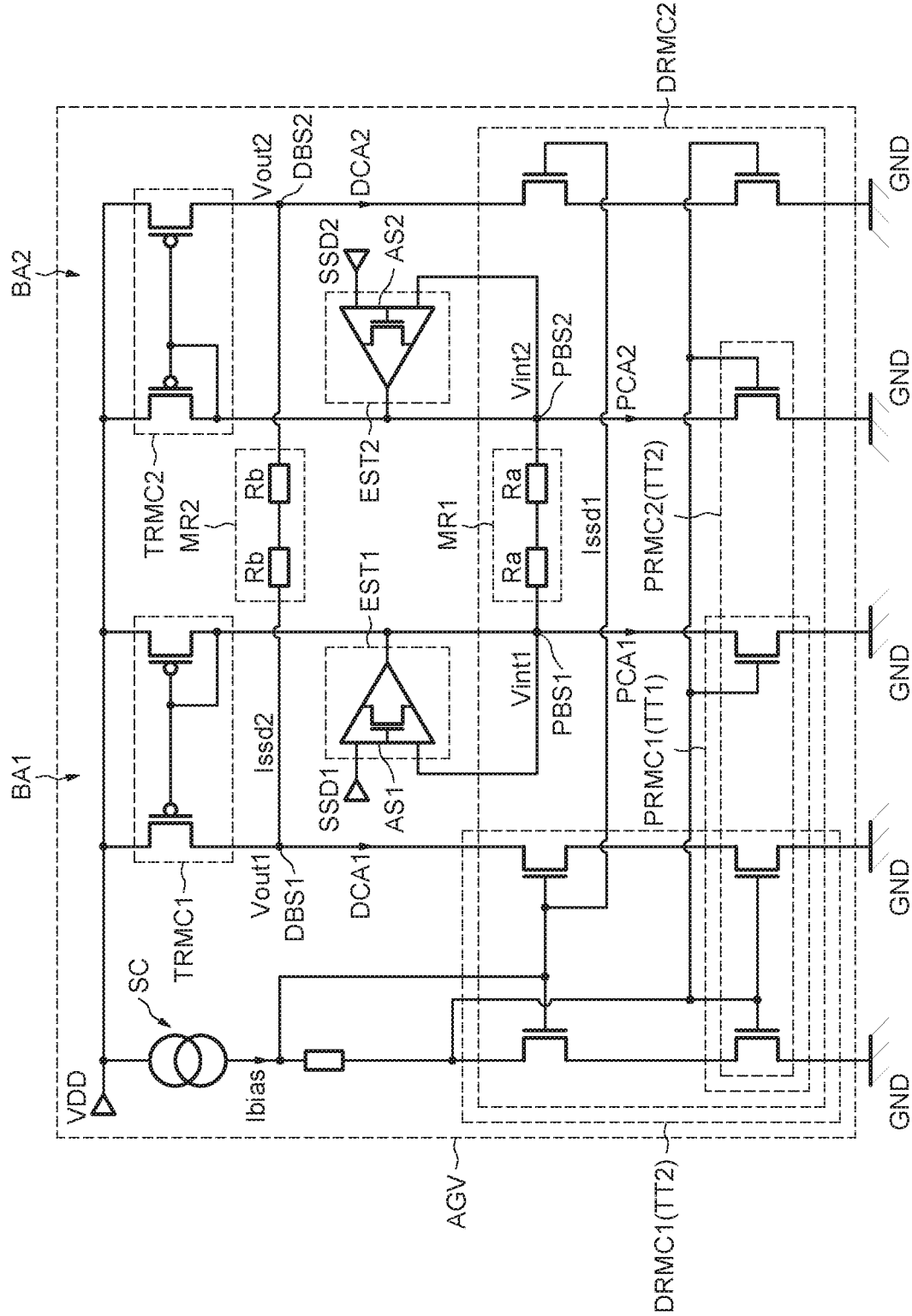

Reference is now made to FIG. 4 in order to illustrate one exemplary embodiment of the structure of the amplifier AGV.

Each voltage follower stage EST1, EST2 of the amplifier AGV in this case includes for example an amplifier connected as a follower AS1, AS2, the first input of which is coupled to the corresponding input EEA1, EEA2, the second input of which is coupled to the output, and the output of which is coupled to the first output terminal PBS1, PBS2.

The use of such a follower amplifier AS1, AS2 advantageously makes it possible to achieve impedance matching and unity gain on the corresponding differential signal SSD1, SSD2.

As a result, each follower amplifier AS1, AS2 is configured to deliver an intermediate voltage Vint1, Vint2 to the corresponding first output terminal PBS1, PBS2. The difference between these intermediate voltages Vint1, Vint2 follows the variation in the voltage of the differential signal SSM1, SSD2.

The first resistive element MR1 has a first fixed equivalent resistance 2Ra, for example formed by two identical first resistors Ra coupled in series.

Due to the difference between the intermediate voltages Vint1, Vint2, a first output differential current signal Issd1 is then obtained via the first resistive element MR1, the value of which current signal is equal to (Vint1−Vint2)/(2*Ra).

It should be noted that the signal Issd1 is an AC current.

Each amplification stage EC1, EC2 includes a first current mirror array PRMC1, PRMC2 coupled between a current source SC and the corresponding first output terminal PBS1, PBS2, a second current mirror array DRMC1, DRMC2 coupled between the current source SC and the corresponding second output terminal DBS1, DBS2, and a third current mirror array TRMC1, TRMC2 coupled between the corresponding first and second output terminals PBS1, PBS2, DBS1, DBS2.

Figure 5:
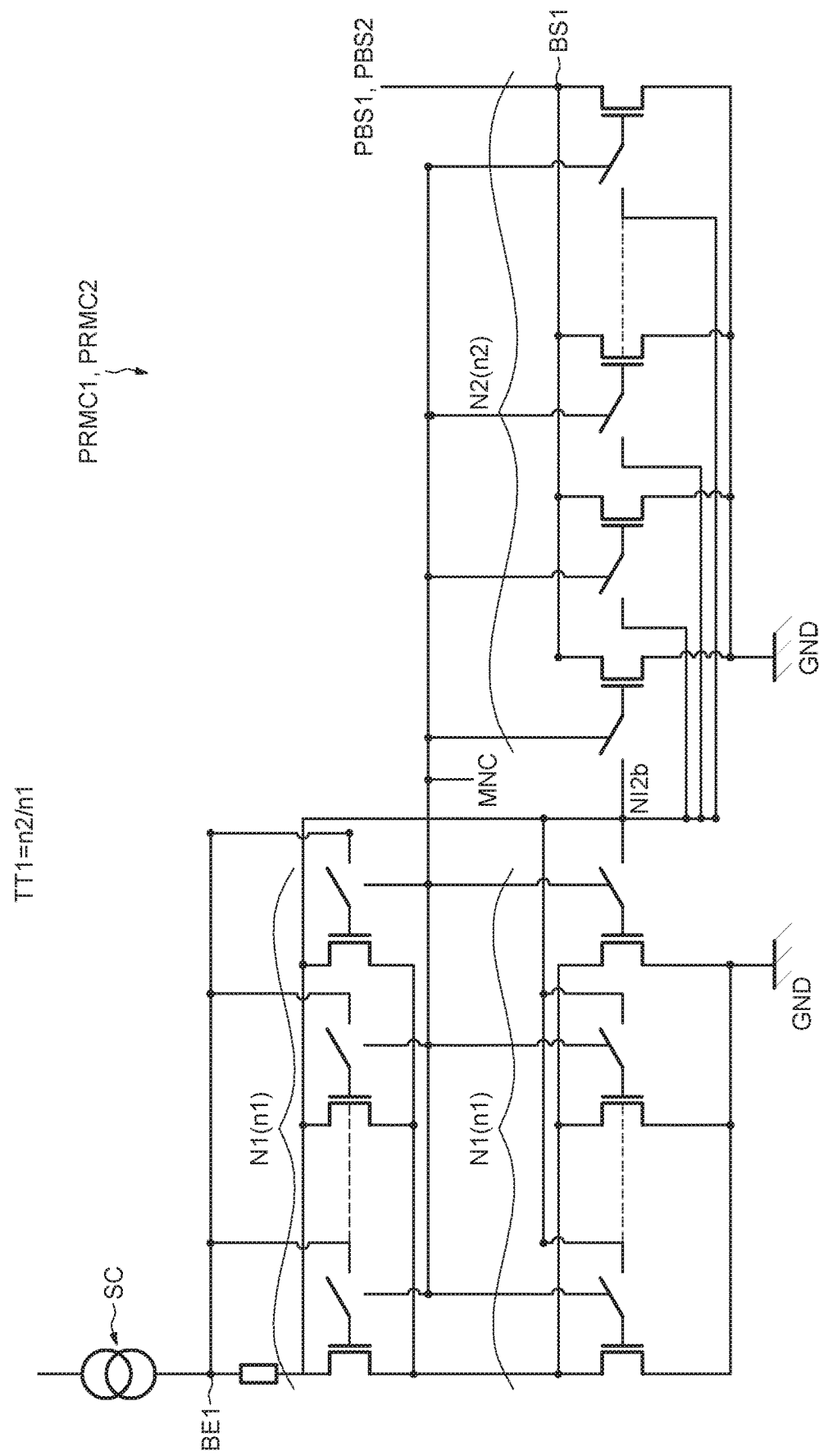
Figure 6:
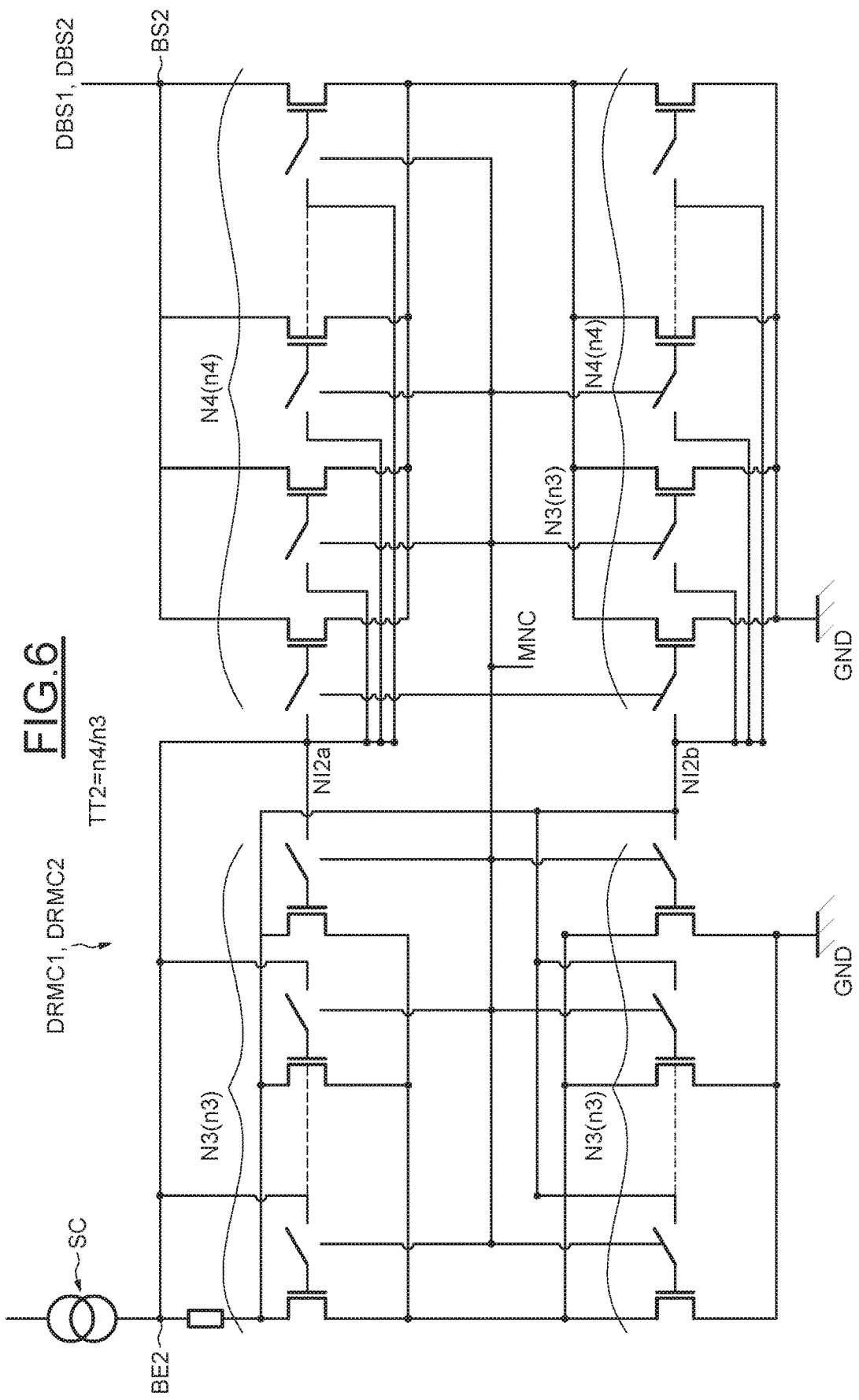
Figure 7:
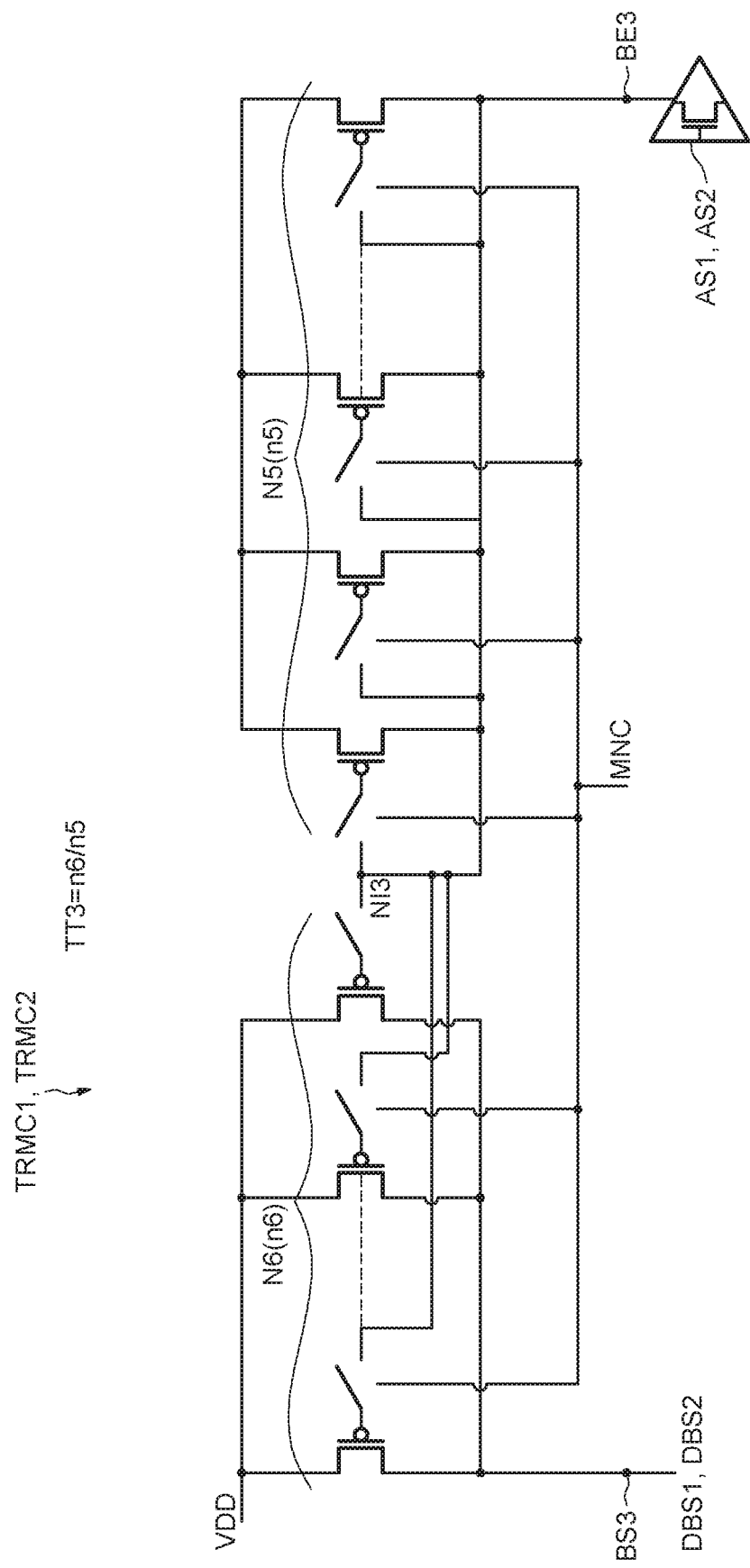

It should be noted that the first, second and third arrays PRMC1, PRMC2, DRMC1, DRMC2, TRMC1, TRMC2 are illustrated by way of indication and function in FIG. 4, and their structures will be illustrated in more detail in FIGS. 5 to 7.

The current source SC is configured to supply the first and second current mirror arrays PRMC1, PRMC2, DRMC1, DRMC2 with a DC-current bias current Ibias.

Each first current mirror array PRMC1, PMRC2 is intended to receive the digital control word MNC and configured to deliver a corresponding first auxiliary current PCA1, PCA2 to the corresponding first output terminal PBS1, PBS2.

Each first auxiliary current PCA1, PCA2 is generated from the bias current Ibias with a first transfer rate TT1 determined by the value of the digital control word MNC, that is to say PCA1=PCA2=Ibias*TT1.

Each second current mirror array DRMC1, DMRC2 is intended to receive the digital control word MNC and configured to deliver a corresponding second auxiliary current DCA1, DCA2 to the corresponding second output terminal DBS1, DBS2.

Each second auxiliary current DCA1, DCA2 is generated from the bias current Ibias with a second transfer rate TT2 determined by the value of the digital control word MNC, that is to say DCA1=DCA2=Ibias*TT2.

Each third current mirror array TRMC1, TRMC2 is intended to receive, at the corresponding first output terminal PBS1, PBS2, the combination of the corresponding first auxiliary signal PCA1, PCA2 and part of the first output differential current signal Issd1.

Each third current mirror array TRMC1, TRMC2 is configured to deliver, to the corresponding second output terminal DBS1, DBS2 via the second resistive element MR2, the combination of the corresponding second auxiliary current DCA1, DCA2 and part of a second output differential signal Issd2.

The second resistive element MR2 has a second fixed equivalent resistance 2Rb, for example formed by two identical second resistors Rb coupled in series.

It should be noted that the first and second auxiliary currents PCA1, PCA2, DCA1, DCA2 are the DC currents and the first and second output differential signals Issd1, Issd2 are the AC currents.

The ratio between the first and second auxiliary currents PCA1, PCA2, DCA1, DCA2 and the ratio between the first and second output differential signals Issd1, Issd2 are all equal to the third transfer rate TT3 of the third current mirror array TRMC1, TRMC2, determined by the value of the digital control word MNC.

Advantageously, the first transfer rate TT1 multiplied by the third transfer rate TT3 is equal to the second transfer rate TT2, so as to ensure that the ratio between the first and second auxiliary currents PCA1, PCA2, DCA1, DCA2 is always equal to the third transfer rate TT3.

Due to this, an output differential voltage signal Vssd=Vout1−Vout2 is obtained via the second resistive element MR2, and the value of this signal Vssd is equal to 2Rb*Issd2. The second DC-current auxiliary currents DCA1, DCA2 are therefore kept stable.

The gain G value of the amplifier AGV is thus equal to G=(Vout1−Vout2)/(Vint1−Vint2)=TT3*Rb/Ra.

If the first and second resistors Ra, Rb are configured to be equal, the gain G value depends only on the third transfer rate TT3, which is itself dependent on the value of the digital control word MNC.

It should be noted that, if the third transfer rate TT3 is less than Ra/Rb, the gain G value is less than 1 and the amplifier AGV then attenuates the differential signal SSD1, SSD2.

The use of the first resistive element MR1 makes it possible to convert the intermediate differential voltage Vint1−Vint2 into a first output differential signal Issd1, and the use of the amplification stages EC1, EC2 including the first, second and third current mirror arrays PRMC1, PRMC2, DRMC1, DRMC2, TRMC1, TRMC2 advantageously makes it possible to amplify the first signal Issd1 instead of a direct voltage amplification on the basis of the first signal Issd1.

Furthermore, the use of the second resistive element MR2 makes it possible to reconvert the amplified current, that is to say the second output differential signal Issd2 into an output differential voltage signal Vssd=Vout1−Vout2.

Here again, it should be noted that the use of the first and second resistive element MR1, MR2 having fixed resistances instead of variable resistances, as normally proposed in the prior art, advantageously allows a reduction in the silicon surface of the amplifier AGV and stabilization with regard to the period between the reception of the differential signal SSM1, SSD2 and the delivery of the output differential voltage signal Vssd. This period is generally greatly influenced by stray capacitances of a variable resistive element.

Reference is now made to FIG. 5 in order to illustrate in more detail one exemplary embodiment of one of the first current mirror arrays PRMC1, PRMC2.

The first current mirror array PRMC1, PRMC2 includes an input terminal BE1 coupled to the current source SC, an output terminal BS1 coupled to the corresponding first output terminal PBS1, PBS2, a first number N1 of NMOS transistors cascode-coupled between the input terminal BE1 and ground GND, and a second number N2 of NMOS transistors coupled between the output terminal BS1 and ground GND.

All of these NMOS transistors are identical, for example.

The gate and the drain of each of the N2 NMOS transistors are coupled. The gate of each of the N1, N2 NMOS transistors is coupled to a first intermediate node NI1 via a corresponding switch.

Each switch is controlled by the value of the digital control word MNC and embodied for example in the form of a transistor, known to those skilled in the art.

If the switches associated with n1 transistors out of the N1 NMOS transistors and with n2 transistors out of the N2 NMOS transistors are configured to be in the on state depending on the value of the digital control word MNC, the first transfer rate TT1 is equal to n2/n1.

Reference is now made to FIG. 6 in order to illustrate in more detail one exemplary embodiment of one of the second current mirror arrays DRMC1, DRMC2.

To increase the minimum output voltage and the output resistance, the second current mirror arrays DRMC1, DRMC2 use for example a cascode-connected current mirror structure and each include an input terminal BE2 coupled to the current source SC, an output terminal BS2 coupled to the corresponding second output terminal DBS1, DBS2, a third number N3 of NMOS transistors cascode-coupled between the input terminal BE2 and ground GND, and a fourth number N4 of NMOS transistors cascode-coupled between the output terminal BS2 and ground GND.

All of these NMOS transistors are identical, for example.

The gate and the drain of each of the N3 cascode NMOS transistors are coupled. The gate of each of the N3, N4 cascode NMOS transistors is coupled to a corresponding second intermediate node NI2a, NI2b, respectively, via a corresponding switch.

Each switch is controlled by the value of the digital control word MNC and embodied for example in the form of a transistor, known to those skilled in the art.

If the switches associated with n3 transistors out of the N3 NMOS transistors and with n4 transistors out of the $N_4$ NMOS transistors are configured to be in the on state depending on the value of the digital control word MNC, the second transfer rate TT2 is equal to n4/n3.

Reference is now made to FIG. 7 in order to illustrate in more detail one exemplary embodiment of one of the third current mirror arrays TRMC1, TRMC2.

Each third current mirror array TRMC1, TRMC2 includes an input terminal BE3 coupled to the corresponding amplifier connected as a follower AS1, AS2, an output terminal BS3 coupled to the corresponding second output terminal DBS1, DBS2, a fifth number N5 of PMOS transistors coupled between a supply voltage VDD and the input terminal BE3, and a sixth number N6 of PMOS transistors coupled between the supply voltage VDD and ground GND.

All of these PMOS transistors are identical, for example.

The gate and the drain of each of the N5 PMOS transistors are coupled. The gate of each of the N5, N6 PMOS transistors is coupled to a third intermediate node NI3 via a corresponding switch.

Each switch is controlled by the value of the digital control word MNC and embodied for example in the form of a transistor, known to those skilled in the art.

If the switches associated with n5 transistors out of the N5 PMOS transistors and with n6 transistors out of the N6 PMOS transistors are configured to be in the on state depending on the value of the digital control word MNC, the third transfer rate TT3 is equal to n6/n5.

It should be noted that the first transfer rate TT1 multiplied by the third transfer rate TT3 is equal to the second transfer rate TT2. In the cases illustrated in FIGS. 5 to 7, (n2*n6)/(n1*n5)=n4/n3.

As a variant, the first, second and third numbers N1, N2 and N3 may all be equal to 1 in order to further reduce the consumption and the silicon surface of the amplifier AGV.

In this case, if the switches associated with N− transistors out of the $N_5$ PMOS transistors and with N+ transistors out of the N6 PMOS transistors are configured to be in the on state depending on the value of the digital control word MNC, each second current mirror array DRMC1, DRMC2 is configured to have a second transfer rate TT2=N+/N−.

In other words, the switches associated with the N+/N− transistors out of the $N_5$ NMOS transistors are configured to be in an on state depending on the value of the digital control word MNC.

What is claimed is:

1. A variable-gain amplifier comprising:
    a first amplification and attenuation branch;
    a second amplification and attenuation branch;
    a first resistive element coupled between the first amplification and attenuation branch and the second amplification and attenuation branch;
    a second resistive element coupled between the first amplification and attenuation branch and the second amplification and attenuation branch;
    wherein the first and second amplification and attenuation branches each include a voltage follower stage and a configurable amplification stage;
    wherein the voltage follower stages are configured to receive a differential signal and to deliver, via the first resistive element, an intermediate differential current signal; and
    wherein the configurable amplification stages are configured to receive the intermediate differential current signal and a digital control word, and to deliver, via the second resistive element, an output differential voltage signal that depends on a value of the digital control word.

2. The variable-gain amplifier according to claim 1, wherein each amplification stage comprises:
    a first current mirror array coupled to a first output terminal;
    a second current mirror array coupled to a second output terminal; and
    a third current mirror array coupled between the first and second output terminals.

3. The variable-gain amplifier according to claim 2, wherein:
    the voltage follower stage of the amplification stage of the first amplification and attenuation branch is coupled to the first output terminal of the first amplification and attenuation branch;
    the voltage follower stage of the amplification stage of the second amplification and attenuation branch is coupled to the first output terminal of the second amplification and attenuation branch; and
    the second resistive element is coupled between the second output terminal of the first amplification and attenuation branch and the second output terminal of the second amplification and attenuation branch.

4. The variable-gain amplifier according to claim 3, wherein the first, second and third current mirror arrays are to be driven depending on the value of the digital control word.

5. The variable-gain amplifier according to claim 4, wherein the first, second and third current mirror arrays are configured to have a first current transfer rate, a second current transfer rate and a third current transfer rate, respectively, the first current transfer rate multiplied by the third current transfer rate being equal to the second current transfer rate.

6. The variable-gain amplifier according to claim 1, wherein the first resistive element has a first fixed equivalent resistance and the second resistive element has a second fixed equivalent resistance.

7. The variable-gain amplifier according to claim 6, wherein the first fixed equivalent resistance is substantially equal to the second fixed equivalent resistance.

8. A circuit comprising:
a first voltage follower stage with an input coupled to receive a first differential signal;
a second voltage follower stage with an input coupled to receive a second differential signal;
a first resistive element coupled between the first voltage follower stage and the second voltage follower stage;
a first configurable amplification stage coupled to the first and second voltage follower stages via the first resistive element;
a second configurable amplification stage coupled to the first and second voltage follower stages via the first resistive element;
a second resistive element coupled between the first configurable amplification stage and the second configurable amplification stage; and
a variable-gain controller with a digital word output coupled to the first and second configurable amplification stages.

9. The circuit according to claim 8, wherein the first and second configurable amplification stages each comprise:
a first current mirror array coupled to a first output terminal;
a second current mirror array coupled to a second output terminal; and
a third current mirror array coupled between the first and second output terminals.

10. The circuit according to claim 9, wherein:
the first voltage follower stage is coupled to the first output terminal of the first configurable amplification stage;
the first voltage follower stage is coupled to the first output terminal of the second configurable amplification stage; and
the second resistive element is coupled between the second output terminal of the first configurable amplification stage and the second output terminal of the second configurable amplification stage.

11. The circuit according to claim 10, wherein the first, second and third current mirror arrays are configured to be driven depending on digital control word carried on the digital word output of the variable-gain controller.

12. The circuit according to claim 11, wherein the first, second and third current mirror arrays are configured to have a first current transfer rate, a second current transfer rate and a third current transfer rate, respectively, wherein the first current transfer rate multiplied by the third current transfer rate is equal to the second current transfer rate.

13. The circuit according to claim 8, wherein the first resistive element has a first fixed equivalent resistance and the second resistive element has a second fixed equivalent resistance, the first fixed equivalent resistance being substantially equal to the second fixed equivalent resistance.

14. The circuit according to claim 8, wherein the circuit is part of a radio frequency communication device.

15. The circuit according to claim 14, wherein the radio frequency communication device is a near-field communication device.

16. A method of operating a variable-gain amplifier that comprises a first amplification and attenuation branch, a second amplification and attenuation branch, a first resistive element coupled between the first amplification and attenuation branch and the second amplification and attenuation branch, a second resistive element coupled between the first amplification and attenuation branch and the second amplification and attenuation branch, wherein the first and second amplification and attenuation branches each include a voltage follower stage and a configurable amplification stage, the method comprising:
receiving a differential signal at the voltage follower stages;
delivering an intermediate differential current signal from the voltage follower stages via the first resistive element;
receiving the intermediate differential current signal at the configurable amplification stages;
receiving a digital control word at the configurable amplification stages; and
generating an output differential voltage signal that depends on a value of the digital control word.

17. The method according to claim 16, wherein the digital control word is received from a variable-gain controller.

18. The method according to claim 16, wherein the differential signal is received from an antenna.

19. The method according to claim 18, wherein the variable-gain amplifier is part of a near-field communication device.

20. The method according to claim 16, wherein the first resistive element has a first fixed equivalent resistance and the second resistive element has a second fixed equivalent resistance, wherein the first fixed equivalent resistance is substantially equal to the second fixed equivalent resistance.

* * * * *